(12) United States Patent
Edler et al.

(10) Patent No.: US 9,893,694 B2
(45) Date of Patent: *Feb. 13, 2018

(54) DEVICE AND METHOD FOR PROCESSING A REAL SUBBAND SIGNAL FOR REDUCING ALIASING EFFECTS

(71) Applicant: Fraunhofer-Gesellschaft zur Foerderung der angewandten Forschung e.V., Munich (DE)

(72) Inventors: Bernd Edler, Hannover (DE); Harald Popp, Tuchenbach (DE)

(73) Assignee: FRAUNHOFER-GESELLSCHAFT ZUR FOERDUNG DER ANGEWANDTEN FORSCHUNG E.V., Munich (DE)

( * ) Notice: Subject to any disclaimer, the term of this patent is extended or adjusted under 35 U.S.C. 154(b) by 198 days.

This patent is subject to a terminal disclaimer.

(21) Appl. No.: 13/717,787

(22) Filed: Dec. 18, 2012

(65) Prior Publication Data

US 2013/0108077 A1     May 2, 2013

Related U.S. Application Data

(63) Continuation of application No. 12/375,728, filed as application No. PCT/EP2007/005659 on Jun. 26, 2007, now Pat. No. 8,411,731.

(30) Foreign Application Priority Data

Jul. 31, 2006   (DE) .................. 10 2006 035 613
Oct. 5, 2006   (DE) .................. 10 2006 047 197

(51) Int. Cl.
   *H03H 7/30*   (2006.01)
   *H03H 7/40*   (2006.01)
   (Continued)

(52) U.S. Cl.
   CPC .......... *H03G 3/00* (2013.01); *G10L 19/0204* (2013.01); *H03H 17/0266* (2013.01); *H03H 2218/04* (2013.01)

(58) Field of Classification Search
   CPC ... G10L 19/008; G10L 19/0212; H04S 3/008; H04S 2400/09; H04S 2420/03
   (Continued)

(56) References Cited

U.S. PATENT DOCUMENTS 5,327,366 A    7/1994  Mau
6,246,345 B1   6/2001  Davidson et al.
(Continued)

FOREIGN PATENT DOCUMENTS

DE    10234130 B3    2/2004
EP    0531242        7/1997
(Continued)

OTHER PUBLICATIONS

India Office Action dated Nov. 25, 2013.
(Continued)

*Primary Examiner* — Alexander Jamal
(74) *Attorney, Agent, or Firm* — McClure, Qualey & Rodack, LLP

(57) ABSTRACT

In order to process a subband signal of a plurality of real subband signals which are a representation of a real discrete-time signal generated by an analysis filter bank, a weighter for weighting a subband signal by a weighting factor determined for the subband signal is provided to obtain a weighted subband signal. In addition, a correction term is calculated by a correction term determiner, the correction term determiner being implemented to calculate the correction term using at least one other subband signal and using another weighting factor provided for the other subband signal, the two weighting factors differing. The correction (Continued)

term is then combined with the weighted subband signal to obtain a corrected subband signal, resulting in reduced aliasing, even if subband signals are weighted to a different extent.

24 Claims, 10 Drawing Sheets

(51) Int. Cl.
    *H03K 5/159*     (2006.01)
    *H03G 3/00*     (2006.01)
    *G10L 19/02*     (2013.01)
    *H03H 17/02*     (2006.01)

(58) Field of Classification Search
    USPC .............. 381/94.2, 94.3, 22, 23; 704/203; 375/232, 229
    See application file for complete search history.

(56) References Cited

U.S. PATENT DOCUMENTS

| | | |
|---|---|---|
| 6,496,795 B1 | 12/2002 | Malvar |
| 6,693,963 B1 | 2/2004 | Taniguchi |
| 7,173,966 B2 | 2/2007 | Miller |
| 7,707,030 B2 | 4/2010 | Edler et al. |
| 2003/0187528 A1 | 10/2003 | Chu et al. |
| 2005/0149339 A1* | 7/2005 | Tanaka ................ G10L 21/038 704/500 |
| 2005/0171785 A1 | 8/2005 | Nomura et al. |
| 2005/0197831 A1 | 9/2005 | Edler et al. |
| 2006/0045294 A1* | 3/2006 | Smyth ................... H04S 7/304 381/309 |
| 2007/0100610 A1 | 5/2007 | Disch et al. |
| 2008/0010061 A1 | 1/2008 | Kjorling et al. |
| 2008/0120116 A1 | 5/2008 | Schnell et al. |
| 2008/0147415 A1 | 6/2008 | Schnell et al. |
| 2008/0249765 A1* | 10/2008 | Schuijers ............ G10L 19/0212 704/203 |
| 2010/0013987 A1* | 1/2010 | Edler ................. G10L 19/0204 348/425.2 |

FOREIGN PATENT DOCUMENTS

| | | |
|---|---|---|
| RU | 2123758 | 12/1998 |
| WO | 2004013839 A1 | 2/2004 |
| WO | 2004/027368 A1 | 4/2004 |
| WO | 2005/109240 | 11/2005 |

OTHER PUBLICATIONS

Russia Office Action dated Sep. 20, 2010.
Russia Decision to Grant dated Nov. 22, 2010.
English translation of abstract of RU 2123758 (Dec. 20, 1998).

* cited by examiner filter part 30      weighting part 31

$L_k(z) = 0.5(H_{ll}(z)X_k(z) - H_{lm}(z)X_{k-1}(z))$, $U_k(z) = 0.5(H_{uu}(z)X_k(z) - H_{um}(z)X_{k+1}(z))$, with $H_{ll}(z)\ \ H_l^2(z)$, $H_{lm}(z)\ \ H_l(z)H_m(z)$, $H_{uu}(z)\ \ H_u^2(z)$, $H_{um}(z)\ \ H_u(z)H_m(z)$.

$p_k = c_{k-1} - c_k$
$q_k = c_{k+1} - c_k$ (filter part of FIGURE 3A)

H(z): filter transfer function
H(z): filter impulse response e.g. filter length 11 ⟷ delay 5

1st filter part

2nd filter part + weighting part
(continued)

$L_k = (-\widetilde{H}_m X_{k-1} + \widetilde{H}_l X_k) \, 0.5$
$X_k = X_k z^{-d}$,
$U_k = (X_k \widetilde{H}_u - \widetilde{H}_m X_{k-1}) \, 0.5$ e.g. filter length 7 ↔ delay 3

1st filter part

2nd filter part + weighting $X_k$: subband samples or sequence of spectral coefficients of equal frequency from successive transform (e.g. MDCT) blocks filter operations for "r2c" and "c2r"

|       | =     | +1    | -1    |
|-------|-------|-------|-------|
| k+2   | $H_m$ | $H_l$ | $H_u$ |
| k+1   | $H_m$ | $H_l$ | $H_u$ |
| k     | $H_m$ | $H_l$ | $H_u$ |
| k-1   | $H_m$ | $H_l$ | $H_u$ |
| k-2   | $H_m$ | $H_l$ | $H_u$ | magnitude frequency responses of the filters for obtaining the correction signals with full filter lengths (H) and shortened to 11 filter lengths (H')

(1)

DEVICE AND METHOD FOR PROCESSING A REAL SUBBAND SIGNAL FOR REDUCING ALIASING EFFECTS

CROSS-REFERENCE TO RELATED APPLICATION

This application is a continuation of U.S. patent application Ser. No. 12/375,728, filed on Sep. 17, 2009, which claims priority to PCT Application No. PCT/EP2007/005659, filed Jun. 26, 2007, with the European Patent Office claiming priority of German Patent Application 102006035613.6 filed on Jul. 31, 2006 and German Patent Application 102006047197.0 filed on Oct. 5, 2006, herein incorporated by reference in its entirety.

The present invention relates to processing audio or video signals and, in particular, to filter banks for converting a signal to a spectral representation, the spectral representation comprising bandpass signals or spectral coefficients.

BACKGROUND OF THE INVENTION

In applications in consumer and communication electronics, the possibility of manipulating the signal spectra by frequency-selectively increasing or decreasing signal intensities is desirable, such as, for example, for equalizer functionalities or echo suppression. In connection with audio coding methods which are based on spectrally decomposing the input signal, it seems to be obvious to correspondingly amplify and/or attenuate the decoded spectral components (subband samples and/or transform coefficients) by means of multiplication by amplification factors which may be temporally alterable. The filter banks used here, however, usually have real values and involve critical sampling. Consequently, the subband signals contain aliasing components which, however, compensate one another with a decomposition (analysis) and merging (synthesis) performed directly one after the other, but not after a manipulation described above. The result may be audible interferences, such as, for example, by amplitude modulation.

FIG. 5 shows a filter bank system comprising an analysis filter bank 50 and a synthesis filter bank 51. A discrete-time signal x(n) is fed to a number of N bandpass filters 53 to obtain bandpass signals decimated by one decimator 54 per filter bank channel. The decimated bandpass signals $x_0(m)$ to $x_{N-1}(m)$ are then fed to an equalizer stage 55, wherein a special weighting coefficient $g_0, g_1, \ldots, g_{N-1}$ is associated to each bandpass signal. The weighted bandpass signals $y_0$ to $y_{N-1}$ are then each fed to an interpolator 56 and filtered by a respective synthesis filter $g_0, g_1, g_{N-1}$ 57. The filtered signals are then added by means of an adder 58 to obtain the output signal y(n) at an output 59 of the filter bank. The signal y(n) is identical to the signal x(n) when all the amplification factors $g_0, g_1, \ldots, g_{N-1}=1$ and when the filters 53 and 57 are adjusted such that the filter bank is of a perfectly reconstructing characteristic.

It is to be pointed out that the filters $h_0$ are typically cosine-modulated versions of a prototype low-pass filter and that the synthesis filters $g_0, g_1, \ldots, g_{N-1}$ are also correspondingly modulated versions of a prototype filter, wherein a filter $g_i$ is matched to a filter $h_i$ so that no artefacts are introduced by filtering.

There are filter banks comprising, for example, 20 filter bank channels, such that 20 samples of the signal x(n) result in one sample of a subband signal $x_i$ each. In this case, the filter bank is referred to as being maximally decimated. Typically, filter banks are realized by numerically efficient mathematical methods such that the filtering occurring in each channel and subsequent decimating are performed in one processing step so that there is no undecimated signal anywhere. Alternative implementations, however, are also known and are implemented depending on the requirements.

When such a filter bank has very many channels, such as, for example, 1024 channels, this represents a transform. The transform rule so to speak implements filtering and decimating "at one strike". An MDCT having 1024 samples may thus be described by the analysis filter bank part 50 in FIG. 5, wherein N in this case would be 1024 and a single sample of a "subband signal" would be generated per block of samples fed to such a transform. The time form of a subband signal would then result if there were several MDCT blocks of spectral coefficients and if the value of the MDCT coefficients in the subsequent blocks for a frequency index were taken as a time signal. Subsequently, whenever subbands and subband values are mentioned, both subband filtering and a transform are meant, without explicitly pointing out every time that a transform represents maximally decimated subband filtering, wherein the number of channels N equals the number of transform coefficients.

The critical sampling of the filter bank signals used has the result that bandpass filters have an overlapping region, i.e. that exemplarily the upper half of the pass region of the filter $h_0$ overlaps the lower half of the neighboring filter $h_1$. At the same time, the upper region of the filter $h_1(n)$ overlaps the lower region of the next filter $h_2(n)$. If there is a signal component in this overlapping region, both the subband signal $x_0(m)$ and the subband signal $x_1(m)$ will have information on this signal component. If both subbands are amplified identically by the amplification factors $g_0$ and $g_1$, that is both amplification factors are equal, the aliasing will be cleared up again by the analysis filters $g_0, g_1$ and the subsequent addition of the output signals of the filters $g_0$ and $g_1$ so that the output signal y(n) is free of artefacts. However, if the two signals $x_0, x_1$ are amplified differently, the portion of the signal components in the overlapping region will also be amplified differently, the result of which is that the receive signal y(n) has more aliasing since the synthesis filter bank "has not expected" a different weighting for the two overlapping filters.

Such artefacts can be avoided by using complex-value filter banks which, however, do not comprise critical sampling and are thus not suitable for encoding. On the other hand, such complex-value filter banks are used in post-processing units, such as, for example, in bandwidth extension (SBR) and in parametric multi-channel encoding (BCC/EBCC).

One possible but expensive solution for this problem is offered by real-value synthesis filtering including subsequent complex-value analysis, manipulation and complex-value synthesis. The implementation expenses of this approach can be reduced considerably by approximating the sequential application of real-value synthesis and complex-value analysis by so-called multiband filtering for generating the imaginary parts ("r2i") that may be used. After a corresponding re-conversion into real parts ("i2r"), the conventional real-value synthesis can be applied.

Such a complicated solution of the aliasing problem using a complex filter bank implementation is shown in FIG. 6. The real signal present in a subband representation is converted to a real time signal by means of a real synthesis filter bank, as is illustrated in FIG. 6 as output signal 61 of the real synthesis filter bank 60. This real time signal 61 is then fed to a complex analysis filter bank 62 to obtain complex-value subband signals 63. These complex subband signals 63 are then fed to a manipulation stage 64 which receives the weighting factors $c_k$ and/or weighting factors $g_i$ of FIG. 5 and which may be set up in the same way as the equalizer stage 55 of FIG. 5. At the output of the manipulation stage 64, there are manipulated complex-value subband signals 65 which are then converted to an output signal 67 which is again a real signal by means of a complex synthesis filter bank 66. In order to obtain a real signal 67, in the complex synthesis filter bank 66, a real part is formed either before adding, which may be identical to the adding of the adder 58 of FIG. 5, or a real part is formed after the addition 58. The imaginary part is simply discarded. The processing by means of the complex analysis filter bank/synthesis filter bank device, however, ensures that there are no more aliasing interferences in the output signal 67 caused by a different manipulation of neighboring subbands.

However, this solution is, as has been mentioned, very complicated since, in contrast to a direct manipulation of FIG. 5, an additional complex analysis filter bank and an additional complex synthesis filter bank may be used, these filter banks being complicated from a calculating point of view and resulting in a delay since the analysis filters and/or synthesis filters comprise considerable filter lengths which may really be in a range of more than 30 filter taps per filter bank, i.e. may be on both the analysis side and the synthesis side. On the other hand, no aliasing is introduced.

A solution which is less complicated is the multiband filtering shown in FIG. 7, where temporally and/or frequency-neighboring subband signals are united such that the processing stages 62, 66 of FIG. 6 are no longer required but replaced by the r2i and i2r blocks, respectively, of FIG. 7. The manipulation by the manipulation stages 64 or 55 would thus take place in the complex representation, i.e. between stages 70 and 71 at 72 in FIG. 7.

In a real-to-complex (r2c) conversion, the series connection of the real-value synthesis filter bank and the complex-value analysis filter bank has been approximated. Here, an imaginary part for each real subband sample is formed by overlaying three filter output signals. The three filters are each applied in the respective subband and the two neighboring bands.

Correspondingly, the conversion from complex to real (c2r) approximates the series connection of the complex-value synthesis filter bank and the real-value analysis filter bank. Here, the real part is formed as a mean value of the original real subband sample and the overlaying of three filter output signals. The three filters are each applied to the imaginary parts in the respective subband and in the two neighboring bands.

The series connection of r2c and c2r has to reconstruct the original subband signal as precisely as possible to avoid audible interferences in the output signal. Thus, the corresponding filters may have relatively great lengths.

Such a multiband filtering which can be applied in an advantageous manner is disclosed in German patent DE 102 34 130 B3. A filter bank device for generating a complex spectral representation of a discrete-time signal includes means for generating a block-wise real-value spectral representation of the discrete-time signal, the spectral representation comprising temporally successive blocks, each block comprising a set of real spectral coefficients. Additionally, means for post-processing the block-wise real-value spectral representation is provided to obtain a block-wise complex approximated spectral representation comprising successive blocks, each block comprising a set of complex approximated spectral coefficients, wherein a complex approximated spectral coefficient may be represented by a first sub-spectral coefficient and a second sub-spectral coefficient, wherein at least either the first or the second sub-spectral coefficient can be established by combining at least two real spectral coefficients. The first sub-spectral coefficient is a real part of the complex approximated spectral coefficient and the second sub-spectral coefficient is an imaginary part of the complex approximated spectral coefficient. The combination is a linear combination and the means for post-processing is implemented to combine, for determining a complex spectral coefficient of a certain frequency, a real spectral coefficient of the frequency and a real spectral coefficient of a neighboring higher or lower frequency or a corresponding real spectral coefficient of a current block, a temporally preceding block or a temporally successive block.

This procedure is of disadvantage in that relatively long filters may be used to obtain a representation free of aliasing, in particular in the case that there is no different weighting in two neighboring subbands, but so to speak the "benign" case that both subbands are weighted equally. If too short filters are used, aliasing will occur also in the benign case, which is unacceptable and results in great filter lengths in blocks r2i 70 and/or i2r 71 in FIG. 7. Great filter lengths, however, at the same time mean calculating complexity and, in particular, a great delay, which is also undesirable for certain applications.

SUMMARY

According to an embodiment, a device for processing a real subband signal of a plurality of real subband signals which are a representation of a real discrete-time signal x(n) generated by an analysis filter bank may have: a weighter for weighting the subband signal by a weighting factor determined for the subband signal to achieve a weighted subband signal; a correction term determiner for calculating a correction term, the correction term determiner being implemented to calculate the correction term using at least one other subband signal and using another weighting factor provided for the other subband signal, the other weighting factor differing from the weighting factor; and a combiner for combining the weighted subband signal and the correction term to achieve a corrected subband signal.

According to another embodiment, a method for processing a real subband signal of a plurality of real subband signals which are a representation of a real discrete-time signal x(n) generated by an analysis filter bank may have the steps of: weighting the subband signal by a weighting factor determined for the subband signal to achieve a weighted subband signal; calculating a correction term using at least one other subband signal and using another weighting factor provided for the other subband signal, the other weighting factor differing from the weighting factor; and combining the weighted subband signal and the correction term to achieve a corrected subband signal.

According to another embodiment, an analysis filter bank may have: a generator for generating a plurality of subband signals from a discrete-time signal; and a device for processing a real subband signal of a plurality of real subband signals which are a representation of a real discrete-time signal x(n) generated by an analysis filter bank, wherein the device may have: a weighter for weighting the subband signal by a weighting factor determined for the subband signal to achieve a weighted subband signal; a correction term determiner for calculating a correction term, the correction term determiner being implemented to calculate the correction term using at least one other subband signal and using another weighting factor provided for the other subband signal, the other weighting factor differing from the weighting factor; and a combiner for combining the weighted subband signal and the correction term to achieve a corrected subband signal, for each subband signal to achieve processed subband signals.

According to another embodiment, a synthesis filter bank may have: for every subband signal of a plurality of subband signals having been generated by an analysis filter bank, a device for processing a real subband signal of a plurality of real subband signals which are a representation of a real discrete-time signal x(n) generated by an analysis filter bank, wherein the device may have: a weighter for weighting the subband signal by a weighting factor determined for the subband signal to achieve a weighted subband signal; a correction term determiner for calculating a correction term, the correction term determiner being implemented to calculate the correction term using at least one other subband signal and using another weighting factor provided for the other subband signal, the other weighting factor differing from the weighting factor; and a combiner for combining the weighted subband signal and the correction term to achieve a corrected subband signal to achieve processed subband signals; and a plurality of synthesis filters for filtering the processed subband signals to achieve synthesis-filtered subband signals; and a summer for summing the filtered subband signals to achieve a discrete-time signal.

According to another embodiment, a method for filtering a discrete-time signal may have the steps of: generating a plurality of subband signals from the discrete-time signal; and for every subband signal, processing the subband signal by a method for processing a real subband signal of a plurality of real subband signals which are a representation of a real discrete-time signal x(n) generated by an analysis filter bank, wherein the method may have the steps of: weighting the subband signal by a weighting factor determined for the subband signal to achieve a weighted subband signal; calculating a correction term using at least one other subband signal and using another weighting factor provided for the other subband signal, the other weighting factor differing from the weighting factor; and combining the weighted subband signal and the correction term to achieve a corrected subband signal to achieve processed subband signals.

According to another embodiment, a method for synthesizing a signal may have the steps of: for every subband signal of a plurality of subband signals having been generated by an analysis filter bank, processing the subband signal by a method according to claim 24 to achieve processed subband signals; and synthesis-filtering the processed subband signals to achieve synthesis-filtered subband signals; and summing the filtered subband signals to achieve a synthesized signal.

According to another embodiment, a computer program may have: a program code for performing the method for processing a real subband signal of a plurality of real subband signals which are a representation of a real discrete-time signal x(n) generated by an analysis filter bank, wherein the method may have the steps of: weighting the subband signal by a weighting factor determined for the subband signal to achieve a weighted subband signal; calculating a correction term using at least one other subband signal and using another weighting factor provided for the other subband signal, the other weighting factor differing from the weighting factor; and combining the weighted subband signal and the correction term to achieve a corrected subband signal, when the computer program runs on a computer.

The present invention is based on the finding that the problems of high artefacts or, in exchange for this, great filter lengths can be solved by dividing subband filtering to a normal portion including a subband weighted by a weighting factor for a special subband, and a correction portion depending on another subband and a weighting factor for the other subband. Thus, an efficient implementation is achieved, since long filters for generating a normal portion are no longer necessary according to the invention, since this normal portion is no longer filtered "back and forth", but simply weighted. The aliasing problem is solved using the correction portion calculated in dependence on another subband which will, for example, be the neighboring subband, and in dependence on a weighting factor for this subband. In order to render the inventively weighted subband "aliasing-proof", the correction portion is combined with the weighted subband, such as, for example, added, to obtain a corrected subband signal resulting in reduced aliasing.

The present invention is of advantage in that the main portion of the corrected subband signal is calculated directly, i.e. only using weighting of the weighting factor provided for this subband signal, and not subjected to filtering. This saves calculating time and, at the same time, calculating power, which is especially important, in particular for mobile or battery-driven apparatuses. No more filtering of the subband itself by means of a long analysis filter and subsequent synthesis filter may be used. Instead, only sample after sample has to be weighted. This is achieved by a division into the weighted portion and the correction term.

The correction term may additionally be calculated by considerably shorter filters, since the precision of the correction portion does not have to be as high as the precision of the normal portion. Inventively, any scaling can be achieved in that filters for the correction portion can be made longer, thereby further reducing aliasing, but, in particular when small aliasing is still allowable, that very short filter lengths can be used for calculating the correction portions which in the extreme case may even be degenerated to a pure multiplication by a factor and subsequent addition, wherein in this case aliasing will of course be stronger than in the case of a filter length of, for example, more than 8 filter taps. On the other hand, it is ensured according to the invention by the subdivision to a normal contribution and a correction contribution that, when there is a benign subband processing, i.e. when neighboring subbands are to be weighted by the same weighting factor, no interference will be introduced although only short filters are used. In this case, the correction portion can simply be set to zero according to the invention, which may be performed manually, which, however, is also achieved automatically when the correction term of a weighting is weighted by the difference of the weighting factors for two neighboring subbands. If the difference equals zero, the two amplification factors will be equal, i.e. the correction term will be set to zero, independent of how big it is, independent of whether the correction term would have provided only a coarse correction or even a fine correction. If the correction term had been calculated more precisely, for this case of identical weighting factors, it would have had to be zero all by itself. With only a coarse correction, however, in this case too, the result would be a correction term unequal to zero which, however, does not corrupt the result since weighting has been performed using the difference of the correction factors.

Depending on the implementation, the correction term is not made only with one subband signal, but with two neighboring subband signals and/or with as many neighboring subband signals as band overlapping within a significant region takes place with, i.e. in the region of the filter where the filter has an attenuation of, for example, smaller than 30 dB. If more than three filters overlap, more than three filters will be considered when calculating the correction term and, of course, also the correction factors associated therewith.

It is to be pointed out that the inventive concept cannot only be performed for filter banks having a relatively small number of channels, where the subband signals are bandpass signals. Rather, the inventive concept may also be applied to filter banks having a great number of filter bank channels, such as, for example, filter banks implemented by a transform. Such a transform is, for example, an FFT, a DCT, an MDCT or another maximally decimated transform where one spectral coefficient per filter bank channel is generated per block of samples. The spectral coefficients having the same coefficient index from a sequence of temporally sequential blocks of spectral coefficients represent a bandpass signal which can be filtered for the purpose of determining a correction term to obtain a correction term.

BRIEF DESCRIPTION OF THE DRAWINGS

Embodiments of the present invention will be detailed subsequently referring to the appended drawings, in which:

FIG. 3b is a more detailed illustration of the filter part of FIG. 3a;

DETAILED DESCRIPTION OF THE INVENTION

Figure 1:
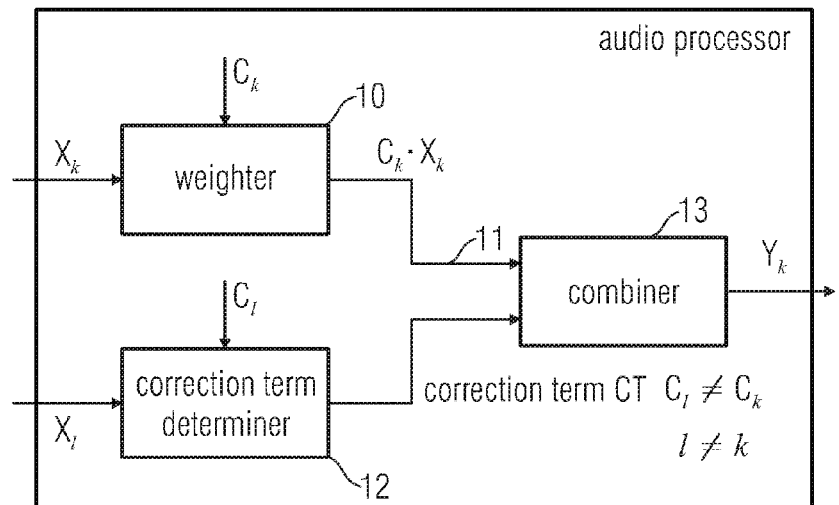
FIG. 1 is a block circuit diagram of an inventive device for processing a real subband signal according to an advantageous embodiment of the present invention.
Figure 5:
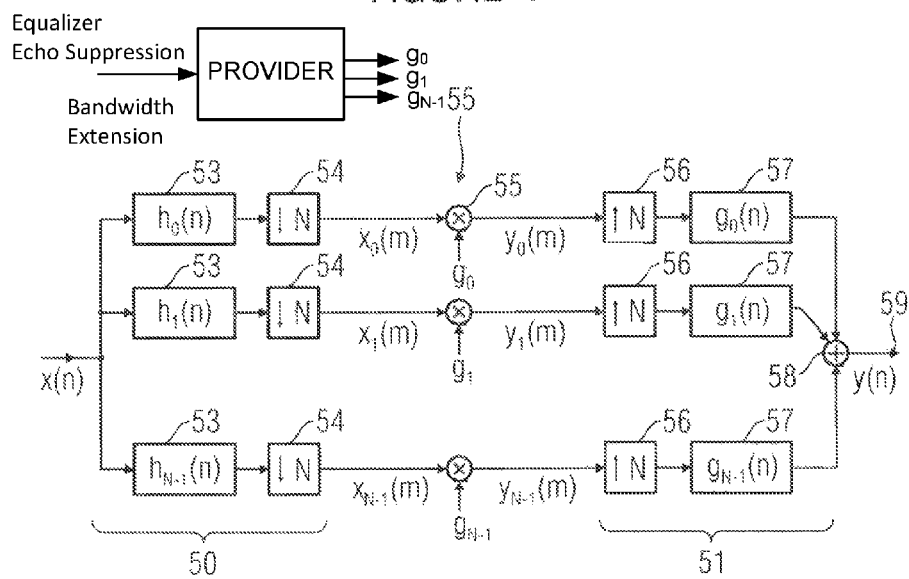
FIG. 5 shows a real-value analysis/synthesis filter bank device having an equalizer stage.
Figure 6:
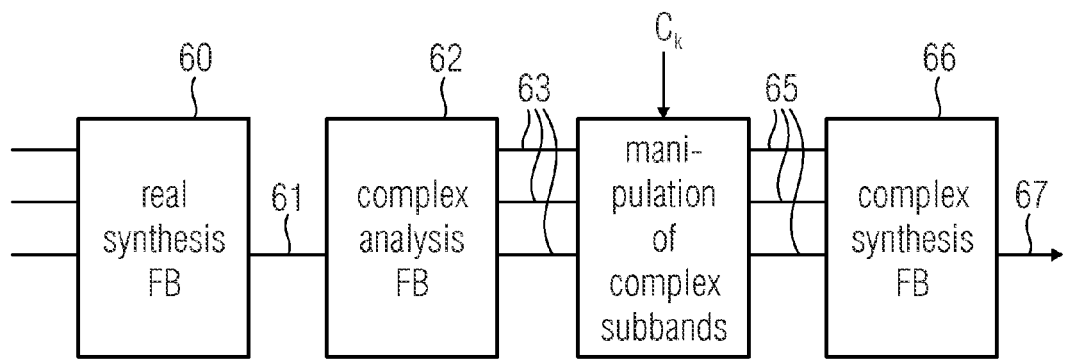
FIG. 6 shows cascading of a real synthesis filter bank with a complex analysis filter bank and a complex synthesis filter bank.
Figure 7:
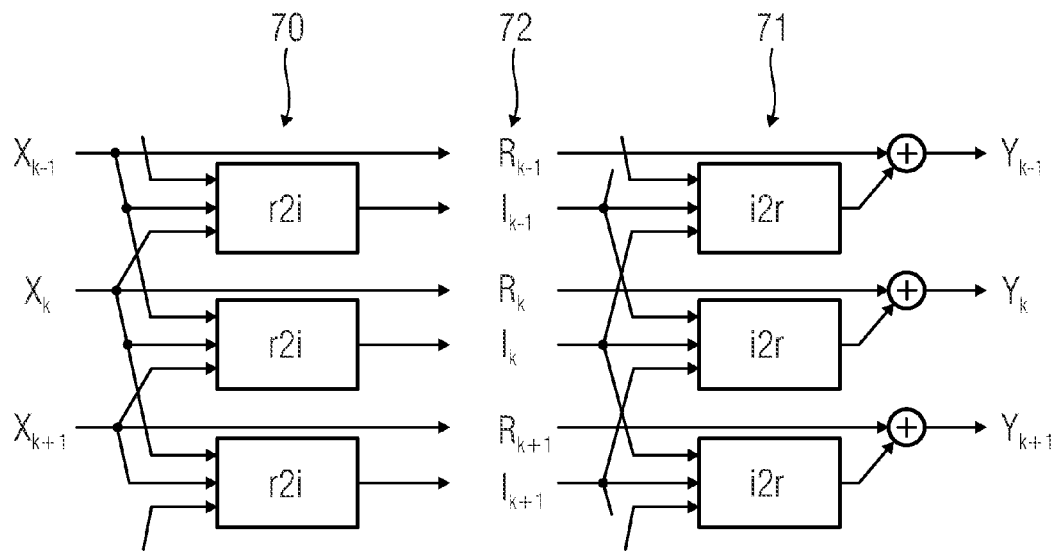
FIG. 7 is a schematic illustration of multiband filtering.

FIG. 1 shows an inventive device for processing a real subband signal x(k) of a plurality of real subband signals which are an illustration of a real discrete-time signal x(n) generated by an analysis filter bank (50 in FIG. 5). The inventive device includes a weighter 10 for weighting the subband signal $x_k$ by a weighting factor $c_k$ determined for the subband signal to obtain a weighted subband signal 11. The weighter is advantageously implemented to perform a multiplication. In particular, subband samples which are samples of a bandpass signal or spectral coefficients of a transform spectrum are multiplied by the correction factor. Alternatively, instead of multiplication, addition of logarithm values may also be performed, namely an addition of the logarithm of the correction value and the logarithm of the subband sample $x_k$.

The inventive device for processing further includes a correction term determiner for calculating a correction term, the correction term determiner being implemented to calculate the correction term using at least another subband signal $x_i$ and using another weighting factor $c_i$ which is provided for the other subband signal, the other weighting factor differing from the weighting factor $c_k$. This differentiation of the two weighting factors is the cause for aliasing in a real filter bank application, even when analysis and synthesis filters have a perfectly reconstructing characteristic. The correction term at the output of the means 12 is fed to a combiner 13 as is the weighted subband signal, the combiner being implemented to combine the weighted subband signal and the correction term to obtain a corrected subband signal $y_k$.

The combiner 13 is advantageously implemented to perform a combination sample by sample. Thus, there is a "correction term sample" for every sample of the weighted subband signal $x_k$ such that a 1:1 correction can be performed. Alternatively, however, for implementations less complicated as to calculating, a correction can be performed such that, for example, a single correction term is calculated for a certain number of weighted subband samples, which is then added in a smoothed or an unsmoothed manner to every sample of the group of samples associated to the correction term sample. Depending on the implementation, the correction term can also be calculated as a factor and not as an additive term. The combiner would in this case perform a multiplication of a correction term by the weighted subband signal to obtain a corrected subband signal $y_k$.

It is to be pointed out that aliasing occurs when two subband signals have been generated by filters having overlapping pass characteristics. In special filter bank implementations, there are such overlapping filter characteristics comprising an overlapping region which is significant for neighboring subband signals.

Figure 2:
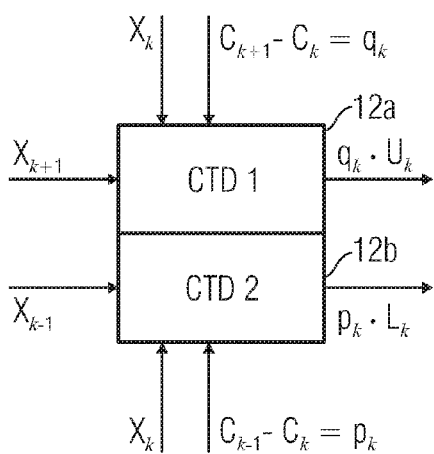
FIG. 2 is a detailed illustration of the correction term determiner of FIG. 1.

Advantageously, the correction term determiner is thus implemented as is illustrated in FIG. 2. The correction term determiner includes a first correction term determiner portion 12a and a second correction term determiner portion 12b. The first correction term determiner portion considers the overlapping of the current subband signal of the index k and the next higher subband signal of the index k+1. Additionally, the correction term determiner portion 12a, apart from the subband signal $x_{k+1}$, also receives the weighting factor $c_{k+1}$ of the higher subband signal. Advantageously, the correction term determiner will also receive the difference of $c_{k+1}$ and $c_k$, which in FIG. 2 is illustrated by $q_k$.

The second correction term determiner portion 12b considers the overlapping of the subband signal $x_k$ with the subband signal $x_{k-1}$ lower by 1 with regard to its index. The correction term determiner portion 12b thus, apart from the subband signal $x_{k-1}$, also receives the weighting factor $c_{k-1}$ for this subband and advantageously the difference of the weighting factor $c_{k-1}$ and the weighting factor $c_k$, which in FIG. 2 is referred to by $c_k$.

On the output side, the first correction term determiner portion 12a provides a first correction term $q_k \times u_k$ and the second correction term determiner portion 12b provides a second correction term $p_k \times L_k$, wherein these two correction terms are added to then be combined with the weighted subband signal $c_k \times x_k$, as will be described referring to FIGS. 3a and 3b.

An advantageous implementation which is shown in greater detail in FIGS. 8 and 3a will be detailed subsequently.

The series connection of a real-value synthesis filter bank and a complex-value analysis filter bank is approximated in multiband filtering. Here, an imaginary part for each real subband sample is formed by overlapping three filter output signals. The three respective filters are applied in the respective subband and in the two neighboring bands.

Correspondingly, the conversion from complex to real (c2r) approximates the series connection of a complex-value synthesis filter bank and a real-value analysis filter bank. Here, the real part is formed as a mean value of the original real subband sample and the overlapping of three filter output signals. The three respective filters are applied to the imaginary parts in the respective subband and the two neighboring bands.

The series connection of r2c and c2r has to reconstruct the original subband signal as precisely as possible in order to avoid audible interferences in the output signal. Thus, the corresponding filters may have relatively great lengths.

The approach presented here is based on the idea of subdividing the series connection of "r2c", "gain control" and "c2r" into signal portions forming when using equal amplification factors, and signal portions forming due to differences between amplification factors of neighboring subbands.

Since the first signal portion is to correspond to the original subband signal, the respective operation can be omitted.

The remaining signal portions are dependent on the differences of the respective amplification factors and only serve the reduction of aliasing components, as would take place in the usual r2c and c2r conversion. Since the respective filters do not influence the reconstruction of unchanged subband signals, they may comprise considerably shorter lengths.

Subsequently, the procedure will be described in greater detail.

The imaginary part in the subband k is calculated from the real-value subband samples of the subbands k, k−1 and k+1 to form:

$I_k(z)=H_m(z)X_k(z)+H_u'(z)X_{k-1}(z)+H_l'(z)+X_{k+1}(z).$

The differentiations between H and H' may be useful due to the mirroring of the subbands having odd indices.

If every subband is multiplied each by an amplification factor $c_k$, the result for the reconstructed signal in the subband k, considering an additional normalization factor of 0.5, will be:

$Y_k(z)=0.5(c_kX_k(z)+c_kG_m(z)I_k(z)+c_{k-1}G_u'(z)I_{k-1}(z)+c_{k+1}G_l'(z)I_{k+1}(z))$

If $c_{k-1}$ is replaced by $c_k+p_k$, with $p_k=c_{k-1}-c_k$, and if $c_{k+1}$ is replaced by $c_k+q_k$, with $q_k=c_{k+1}-c_k$, the result will be:

$$Y_k(z)=0.5c_k(X_k(z)+G_m(z)I_k(z)+G_u'(z)I_{k-1}(z)+G_l'(z)I_{k+1}(z))+0.5(p_kG_u'(z)I_{k-1}(z)+q_kG_l'(z)I_{k+1}(z)). \quad (2)$$

Here, the first term corresponds to the subband signal which is reconstructed when using the same amplification factors in all subbands, and thus equals the original subband signal except for the factor $c_k$, and/or should be like that. However, the second term represents the influence of different amplification factors and can be considered as a correction term for the subband k of the complex processing compared to the real processing. It is calculated as follows:

$$C_k(z)=0.5p_kG_u'(z)(H_m'(z)X_{k-1}(z)+H_u(z)X_{k-2}(z)+H_l(z)X_k(z))+0.5q_kG_l'(z)(H_m'(z)X_{k+1}(z)+H_u(z)X_k(z)+H_l(z)X_{k+2}(z)). \quad (3)$$

The following connections result from the characteristics of the polyphase filter bank and the mirroring of the subbands having odd indices:

$H_m'(z)=-H_m(z), H_l'(z)=-H_u(z), H_u'(z)=-H_l(z),$ $G_m(z)=-H_m(z), G_u'(z)=H_l(z), G_l'(z)=H_u(z),$ $$G_u'(z)H_u(z)\approx 0, G_l'(z)H_l(z)=H_u(z)H_l(z)\approx 0. \quad (4)$$

A substitution has the following result:

$$C_k(z) = 0,5p_kH_l(z)(H_l(z)X_k(z) - H_m(z)X_{k-1}(z)) + \quad (5)$$
$$0,5q_kH_u(z)(H_u(z)X_k(z) - H_m(z)X_{k+1}(z)).$$

Since the reconstruction is no longer dependent on the filters used with amplification factors constant over the subbands, they can be replaced by shorter ones, wherein a respective product filter can also be approximated so that two correction terms can then be calculated instead of the imaginary part:

$L_k(z)=0.5(H_{ll}(z)X_k(z)-H_{lm}(z)X_{k-1}(z))$ $U_k(z)=0.5(H_{uu}(z)X_k(z)-H_{um}(z)X_{k+1}(z))$ with $H_{ll}(z)\approx H_l^2(z), H_{lm}(z)\approx H_l(z)H_m(z), H_{uu}(z)\approx H_u^2(z),$
$$H_{um}(z)\approx H_u(z)H_m(z). \quad (6)$$

The desired subband signal including aliasing compensation is obtained by a weighted overlapping of the original subband signal and the two correction signals:

$$Y_k(z)=c_kX_k(z)+p_kL_k(z)+q_kU_k(z). \quad (7)$$

However, in practical realizations it may be kept in mind that a delay compensating the delay in the respective signal paths including filtering has to be introduced into the signal paths without filtering.

For checking the overall performance, the following pictures show the output signals after filter bank analysis, attenuation of a subband by 20 dB and subsequent filter bank synthesis for different input signals.

The approach described may also be combined with the MDCT instead of the filter bank used in EBCC.

Suitable filter coefficients for filters having a length of 5 have been generated for this. This corresponds to the uncut filters resulting when sequentially applying the corresponding transforms and/or re-transforms. Compared to the "r2c–c2r" technology, however, the new method is of advantage in that it does not generate approximation errors as long as the MDCT spectrum remains unchanged. With "r2c–c2r", however, errors would result since only the two respective neighboring bands are considered in the approximation.

The resulting signal spectra for a sine tone which is 10% above a band limit show that the aliasing components are also reduced very efficiently in connection with MDCT. Here, too, the neighboring band has been attenuated by 10 dB.

Thus, the equalizer functions and/or echo suppression methods can be integrated directly in an audio decoder, such as, for example, MPEG-AAC, by the inverse MDCT before re-transforming.

Figure 8:
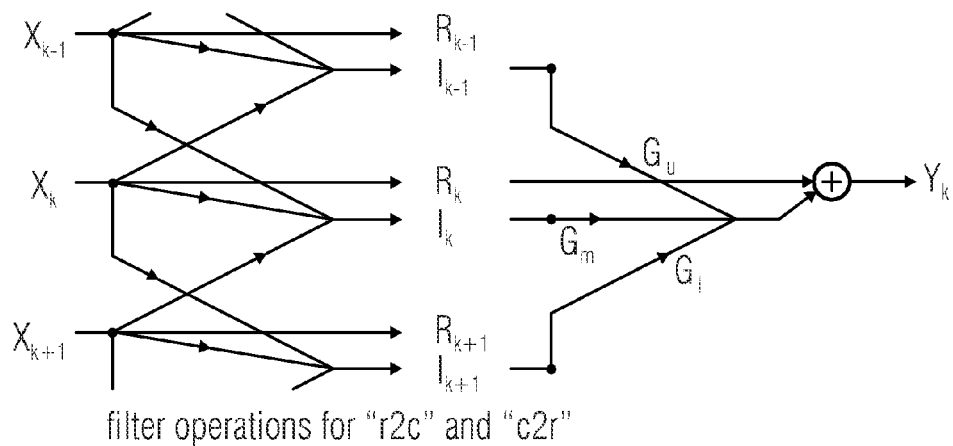
FIG. 8 is a more detailed illustration of filter operations for the multiband filtering of FIG. 7.
Figures 9, 10:
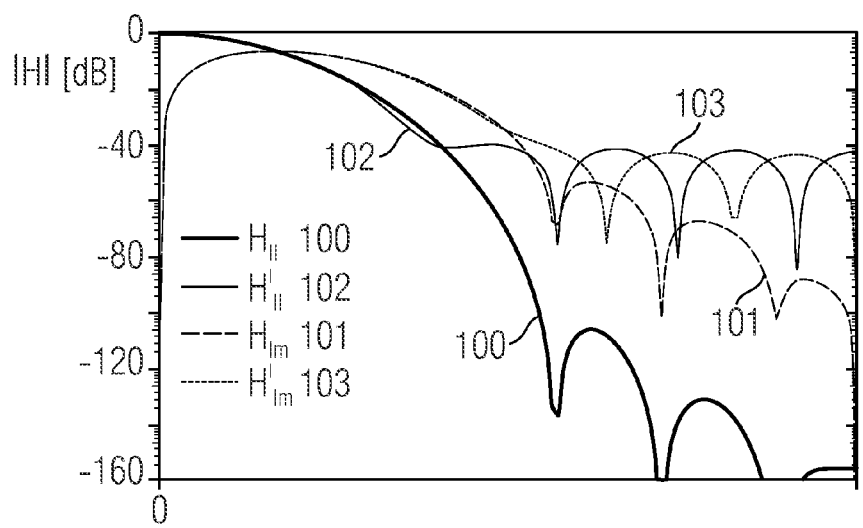
FIG. 9 is a tabular illustration of the filters for subband signals having even and odd indices.
FIG. 10 shows an exemplary comparison of magnitude frequency responses for filters for determining a correction term.

FIG. 8 shows a schematic illustration of the filter operations for real to complex (r2c) and complex to real (c2r). The imaginary component $I_k$ of the band $x_k$ is generated by a subband signal $x_{k-1}$ filtered by the filter $H'_u$ and by the subband signal of subband $x_{k+1}$ generated by the filter $H'_l$. In addition, a component of the subband signal $x_k$ filtered by the filter $H_m$ contributes to the imaginary component $I_k$. Because the portion of the subband signal $x_{k-1}$ overlapped by the filter k has a low-pass characteristic, the filter $H'_u$ is a low-pass filter. In analogy, the portion of the upper subband signal $x_{k+1}$ overlapped by the filter for $x_k$ is a high-pass signal, so that $H'_l$ is a high-pass filter. As has already been explained, H and H' are differentiated to consider the mirroring of the subbands having odd indices. This inflection of H and H' is illustrated in FIG. 9 for the imaginary parts of the subbands $I_{k+2}$ to $I_{k-2}$. In addition, the index "m" stands for "mid" and refers to the contribution of the center subband signal. Furthermore, the index "l" stands for "low" and considers the contribution of the lower subband shown in FIG. 8 to the current subband, i.e. the subband having an index lower by 1. In analogy, "u" stand for "up" and refers to the contribution of the subband illustrated at the top in FIG. 8 for the current subband, i.e. to the subbands having an index higher by 1.

The synthesis filters G corresponding to the individual analysis filters H are illustrated in FIG. 8. $G_l$ has a high-pass characteristic, whereas $G_u$ has a low-pass characteristic. Thus, as has been described before, the product of $G_u$, and $H_u$ is the same as the product of $H_l$ and $H_u$ or the product of $G_l$, and $H_l$ is the same as the product of $H_u$ and $H_l$ and nearly equals 0, since here a respective high-pass filter is multiplied by a low-pass filter and the resulting frequency response of a high-pass filter and a low-pass filter having similar cutoff frequencies equals 0 and/or approximates 0. Even for cases in which the cutoff frequencies are not identical but are apart, the resulting frequency response equals 0. If the cutoff frequency of the low-pass filter is smaller than the cutoff frequency of the high-pass filter, the resulting frequency response will also equal 0. Only in the case in which the cutoff frequency of the low-pass filter is higher than the cutoff frequency of the high-pass filter, the approximation given above would not hold true. However, such a situation does not occur in typical polyphase filter banks and/or would, if occurring, only result in slight interferences which would result in a somewhat more imprecise correction term. Due to the fact that the correction term is advantageously weighted by the difference of the two weighting factors concerned, this error would also decrease with a decreasing difference.

FIG. 3 shows a schematic illustration of the advantageous filters derived above which are implemented by the inventive correction term determiner 12. It becomes obvious from FIG. 3a that the entire device includes a filter part 30 and a weighting part 31. The weighter 10 of FIG. 1 symbolized in the weighting part 31 of FIG. 3a by $c_k$ is in the weighting part 31. The combiner 13 of FIG. 1 corresponds to the adder 13 in FIG. 3a. The correction term determiner 12 includes the filter actions with the four filters $H_{lm}$, $H_{ll}$, $H_{uu}$ and $H_{um}$. In addition, the correction term determiner also includes the weighting of the unweighted correction terms $L_k$ and $U_k$ by the difference of the respective two weighting factors concerned, i.e. by $q_k$ and $p_k$, respectively, as is indicated in the weighting part 31. A more detailed implementation of the filter part of FIG. 3a is illustrated in FIG. 3b. The subband signal $x_{k-1}$ is fed to the low-pass filter $H_{lm}$ 32. In addition, the subband signal $x_k$ is fed to the low-pass filter $H_{ll}$ 33. In addition, the subband signal $x_k$ is fed to the high-pass filter $H_{uu}$ 34 and in addition the next subband signal $x_{k+1}$ is fed to the filter $H_{um}$ 35 which may also be implemented as a high-pass filter. The output signals of filters 32 and 33 are combined in an adder 34 and represent a first unweighted correction term $l_k$. Additionally, the output signals of the filters 34 and 35 are added in an adder 35 and represent a second unweighted correction term $u_k$. In addition, the delay of the filters occurring when the filters are implemented as digital filters, i.e. FIR or IIR filters, is considered for the subband signal $x_k$ which is weighted by the weighting factor $c_k$ provided for this subband signal. This considering of delays of the filters 33 to 35 takes place in a delay stage 38 and can occur before or after weighting. In order for such an implementation to achieve maximum quality, it is advantageous for all the filter lengths 32, 33, 34, 35 to be identical and for the delay 38 to be adjusted to the filter length of the filters 32 to 35. If, for example, the filters 32 to 35 each have a filter length of 11, the delay 38 has to provide a delay magnitude of five subband signal samples.

Figure 3A:
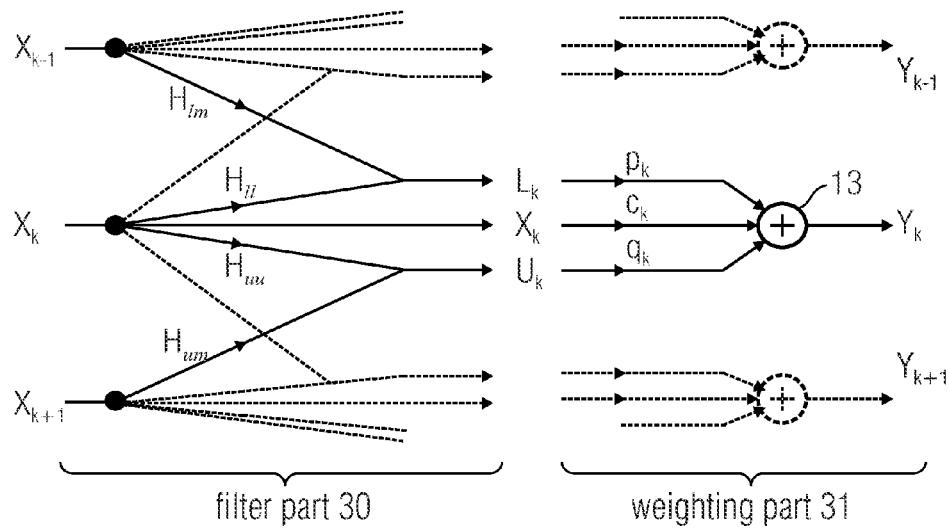
FIG. 3a is a schematic illustration of the inventive device according to an advantageous embodiment of the present invention.
Figure 3B:
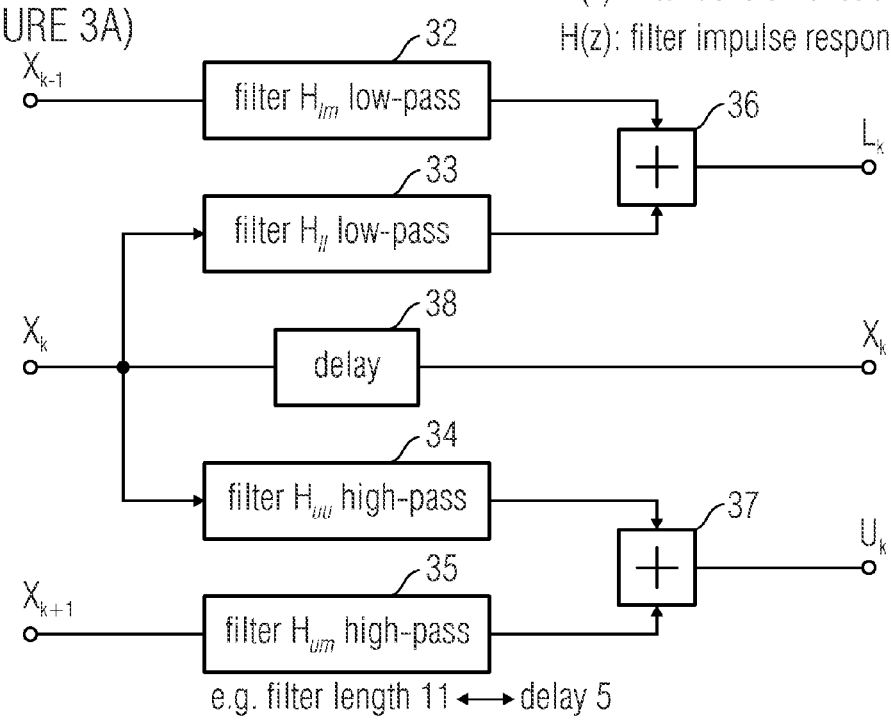
Figure 3C:
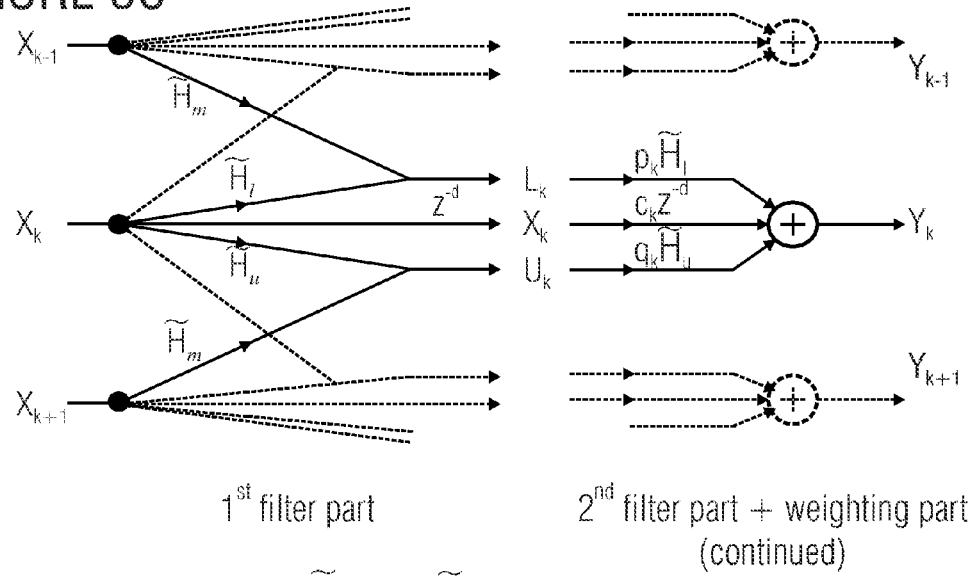
FIG. 3c is a schematic illustration of the inventive device according to an alternative embodiment of the present invention.
Figure 3D:
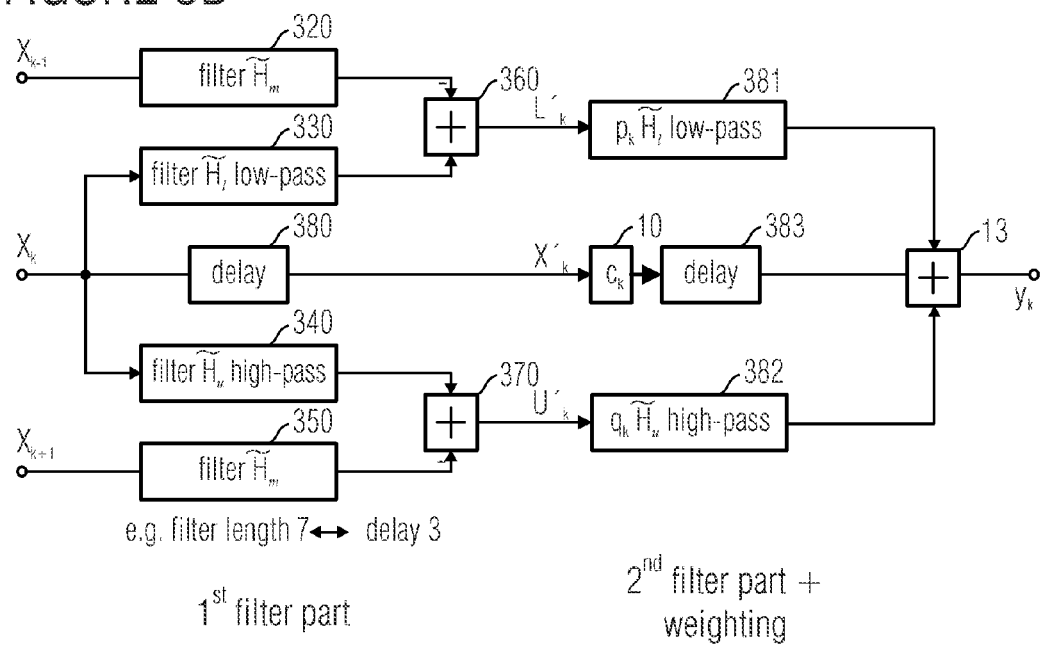
FIG. 3d is a more detailed illustration of the device schematically shown in FIG. 3c.

While FIGS. 3a and 3b illustrate the situation in which the filters 32, 33, 34, 35 are represented as product filters, i.e. as filters for calculating the terms $l_k$, $u_k$ which then only have to be weighted, FIGS. 3c and 3d show an embodiment of an implementation of the present invention where the correction term is not calculated by 4 product filters, but all in all 6 individual filters 320, 330, 340, 350, 381, 382.

As is illustrated in particular in FIG. 3c, the signal $L_k$ is calculated by filtering $X_{k-1}$ by the filter $H_m$ and by adding the filtered signal $X_k$ having been filtered by $H_l$. Again, the normalization factor of 0.5 has been introduced. This normalization factor, however, can be omitted, as is the case in the first embodiment, or be set to a different value, including 1. Furthermore, the other component $U_k$ is calculated by filtering $X_k$ by $H_u$, wherein $X_{k+1} \cdot H_m$ is subtracted from $X_k \cdot H_u$. In contrast to the equations shown under FIG. 3a, where the products have already been considered in the filters, the signals in FIG. 3c are filtered individually. The results $L_k$ and $U_k$ will then, as is shown in FIG. 3a, be weighted by $p_k$ and $q_k$, respectively. In addition to this weighting, filtering by $H_l$ and $H_u$ is performed.

In contrast to FIG. 3a, there is a first filter part and additionally a second filter part which may be integrated and/or combined with the weighting part. The weighting factors can thus already be considered in the filter coefficients or can be applied separately before or after filtering by the digital filter $H_l$ and/or $H_u$. Thus, the delays $z^{-d}$ consider the delay caused by the filtering in the first filter part of the two components $X_{k-1}$ and/or $X_{k+1}$ and additionally consider the delays in the second filter part caused by the filtering of $L_k$ and/or $U_k$ which are filtered by the filters $H_l$ and/or $H_u$.

Although, depending on the filter bank implemented, any filter characteristics can be used for the filters $H_n$, $H_l$, $H_u$, it is advantageous to use a low-pass filter for $H_l$, it is advantageous to use a high-pass filter for $H_l$ and/or it is also advantageous to use a bandpass filter for $H_m$. The filter $H_l$ has a similar form as FIG. 10, since $H_{ll}$ 100 in FIG. 10 equals the square of the filter $H_l$. The filter $H_u$ implemented as a high-pass filter results by mirroring the left part in FIG. 10 at a vertical axis at π/2, i.e. about in the center of FIG. 10. The filter $H_{lm}$ which is no longer there in FIG. 3c since it is a product filter of a bandpass filter and a low-pass filter, could be mirrored at the line at π/2 to obtain the filter $H_{um}$ 35 in FIG. 3b, although this product filter in an assembled form is no longer there in FIG. 3c, but is first calculated implicitly before then combining the components by the combiner 13.

Whereas in FIG. 3b the correction term determiner 12 of FIG. 3a is implemented by the filter part 30 and the weighting of the components $L_k$, $U_k$ by the weighting factors $p_k$ and $q_k$, the correction term determination according to FIGS. 3c and 3d takes place in a kind of double filter stage, wherein at first the signals $L_k$, $U_k$ at the output of the summers 360 and/or 370 are calculated, not using product filters, but using the individual filters, wherein in the second filter part the weighting by $p_k$ and/or $q_k$ is then performed with subsequent individual filtering.

The weighting of the subband signal $X_k$ by the weighter 10, however, takes place in FIG. 3d like in FIG. 3a.

In the embodiment shown in FIG. 3c and FIG. 3d or put generally, two filters are not united to form a product filter. Instead, they are implemented as individual filters. Even if there is no uniting in the product filter, there is—apart from the implementation—still the advantage of shortened filter lengths. Thus, the delay compared to a direct recalculation from real to complex and/or complex to real is reduced. The swung dash above the filters in blocks 320, 330, 340, 350, 381, 382 means that the filters, as are schematically indicated in FIG. 10 for the product filters, are reduced in their filter lengths compared to a subband filter of a normal filter bank. It is advantageous to use filter lengths which are smaller than a filter length of a subband filter to generate the subband signals $x_{k-1}$, $x_k$ and/or $x_{k+1}$. In addition, it is advantageous for the filter lengths of the filters $h_u$, $h_m$, $h_l$ after the approximation, i.e. after shortening, to be, like in the other case, at most 50% of the length of a filter which has been used to generate a subband signal by applying several such filters in a subband filter bank.

Advantageously, filter lengths of <21 are advantageous, wherein the delay of such filters is <10. The implementation shown in FIG. 3d provides, in comparison to the implementation shown in FIGS. 3a and b, advantages with quickly time-variable attenuation factors. With regard to the time form, the implementation shown in FIG. 3d is more similar to the real/complex-complex/real implementation, whereas in the product filter realization, no more filtering takes place after applying the amplification factors.

Irrespective of whether a realization with individual shortened filters or a summary with product filters is chosen, aliasing-reduced quick real filter banks are implemented according to the invention. In specially advantageous embodiments, the filter lengths in FIG. 3d are even reduced compared to the filter lengths in FIG. 3b in that the entire calculation in FIG. 3d has a similar delay as the entire calculation in FIG. 3b. An implementation similar to FIG. 3b would then in FIG. 3d be for the filters in the first filter part to have a filter length of 7 coefficients, which would correspond to a delay magnitude of 3 samples of a subband signal. In this case, the second delay 383 and/or the subsequent filters 381, 382, for example, would have a filter length of 4 to implement a delay of 2. It is pointed out here that somewhat longer or somewhat shorter filters and/or an implementation in FIG. 3d will also bring about advantages when the overall delay is somewhat greater than the product filter delay of FIG. 3b.

Figure 4:
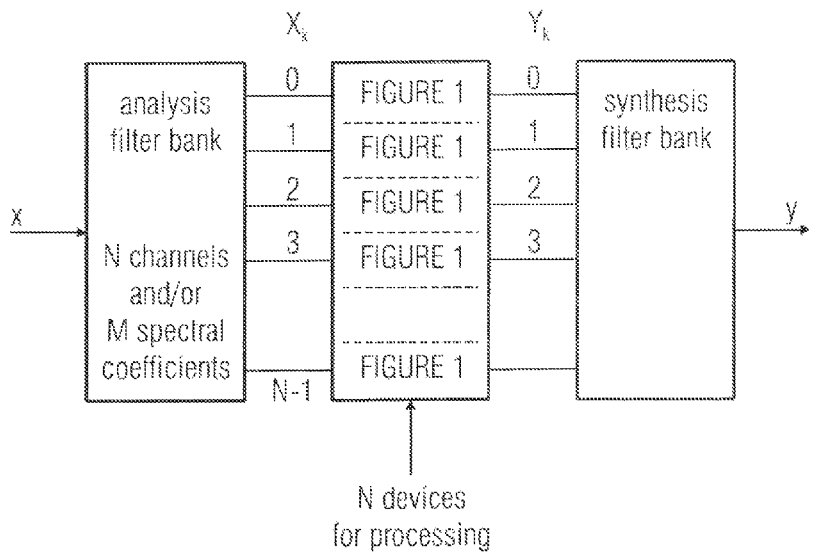
FIG. 4 shows an analysis filter bank/synthesis filter bank device having a subband-wise device for processing.

FIG. 4 shows the usage of the device for weighting described in FIGS. 1 to 3d in an analysis filter band and/or synthesis filter bank. It becomes obvious from FIG. 4 that for every filter channel 0 to N−1, one device as shown in FIG. 1 may be used. Advantageously, however, every device for processing has, when implemented like in FIG. 3b, the same four filters 32 to 35 so that only the same four filters have to be calculated and/or optimized irrespective of the number of subband signals and/or filter channels of an analysis/synthesis filter bank.

The actual calculation of the filters may be performed either by a direct calculation from the analysis/synthesis prototype filters or by a numerical optimization which typically takes place in a computer-aided manner. In such a numerical optimization of filters 32 to 35, a filter length is preset so that a set of filters for different filter lengths can be obtained. As is in particular illustrated in FIG. 10, the marked low-pass characteristic is obtained for the filter with the filter transfer function 100, i.e. $H_{ll}$, or for the filter with the filter transfer function 101, i.e. $H_{lm}$. However, it can be seen that these filter with a very marked attenuation in the blocking region can be approximated by considerably shorter filters, namely by the filters 102 or 103. The filters 102 and 103 have a filter length of only 11 and thus approximate the filters 100 and 101. However, it can be seen that in the region of low frequencies, the deviations are very low and only increase at higher frequencies. However, on the other hand, a blocking attenuation of greater than 40 dB is ensured by the filters 102 and 103 so that these very short filters already cause good aliasing suppression.

Figure 11:
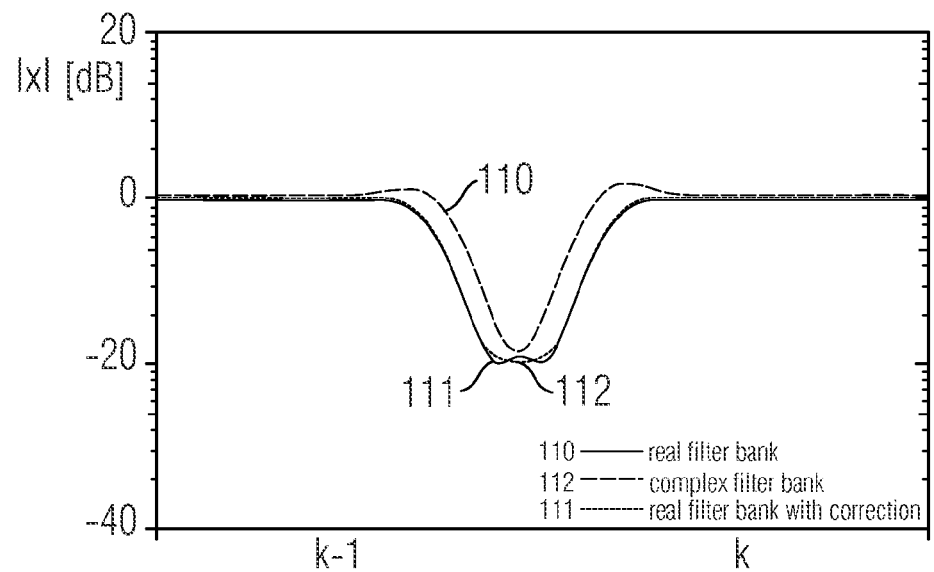
FIG. 11 shows subband filtering of an impulse.

FIG. 11 shows a response of the filter bank for an impulse at a position 8 in a subband sample period. A real filter bank provides a form indicated at 110. A complex filter bank provides a form indicated at 112. A real filter bank including correction according to the present invention provides the form indicated at 111. It can be seen that the real filter bank including correction has nearly the same form as the complex filter bank, however can be implemented considerably cheaper. Only directly at the band limit between k−1 and k does the real filter bank including correction exhibit a wavy form, which can be attributed to the fact that only filter lengths of 11, as is illustrated in FIG. 10, instead of complete filters, as were illustrated in FIG. 10, are used. It is apparent that the deviation between the real filter bank including correction and the complex filter bank which is aliasing-resistant is negligible although short filters 32 to 35 of FIG. 3b are already used. The deviation between the forms 111 and 112 becomes greater with shorter filter lengths, however, for a delay-optimized variation, filter lengths smaller than 5 may be used, wherein the deviation between the curves 111 and 112 still remains reasonable.

Figure 12:
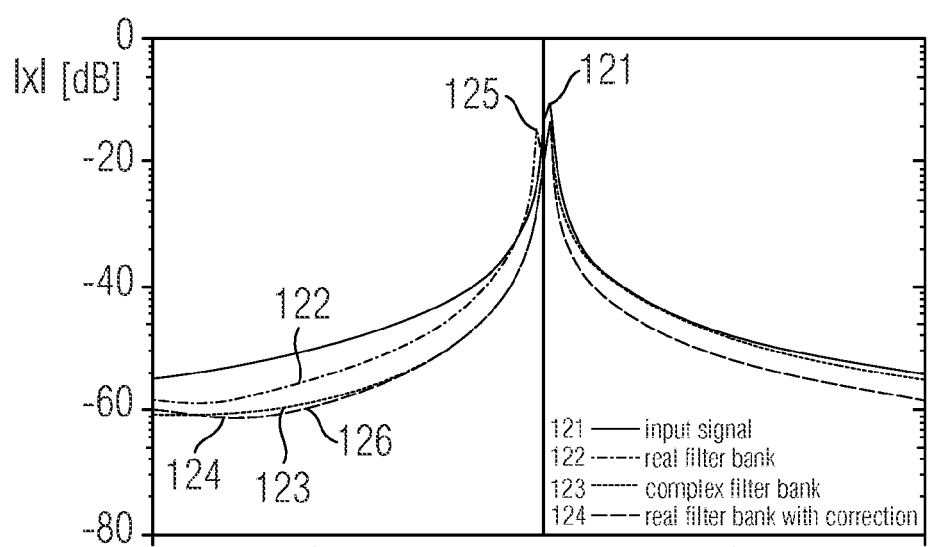
FIG. 12 shows subband filtering of a sine tone at 1% above the band limit.

Subsequently, a filter bank response when a sine tone at 1% above the band limit is considered is shown in FIG. 12. The input signal 121 represents the sine tone. A real filter bank would produce aliasing, as is illustrated by a curve 122. Aliasing becomes noticeable by the "secondary peak" 125, wherein this secondary peak is caused by the fact that the neighboring bands k−1 and k have been weighted by different weighting factors. Again, it is apparent that a complex filter bank does not have such a secondary peak, i.e. does not generate such aliasing, and that the complex filter bank is approximated optimally by a real filter bank including correction, wherein a deviation of the real filter bank to the complex filter bank is only in the region 126. The real filter bank provides a greater attenuation than the complex filter bank, which in turn can be attributed to the fact that the filter lengths of the filters 32 to 35 have been shortened to 11.

It is to be pointed out that in the example in FIG. 12, and in the examples in FIGS. 13, 14, 15, 16, 17, there has been an attenuation of a subband by 20 dB compared to the other subband.

Figure 13:
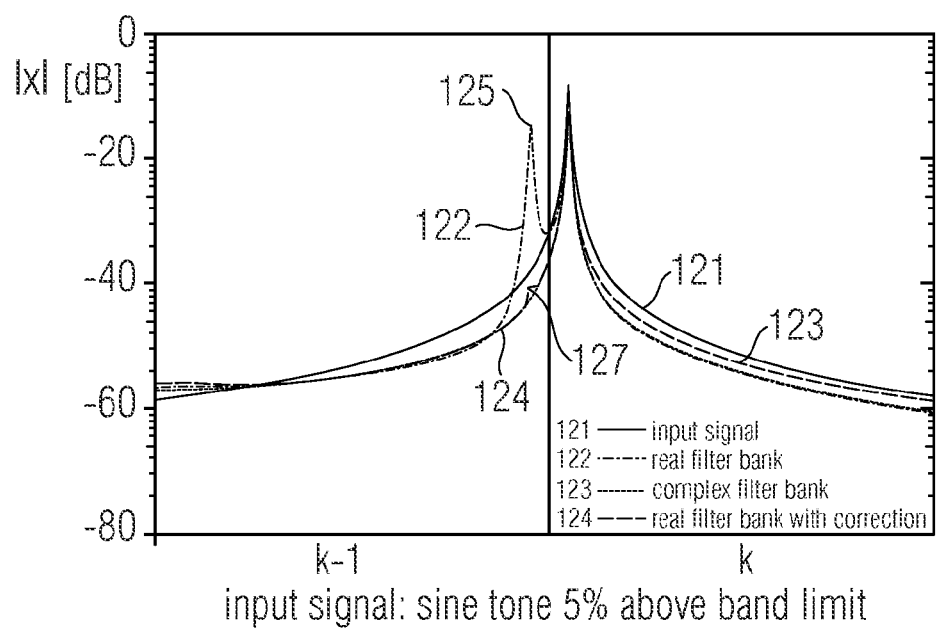
FIG. 13 shows subband filtering of a sine tone at 5% above the band limit.
Figure 14:
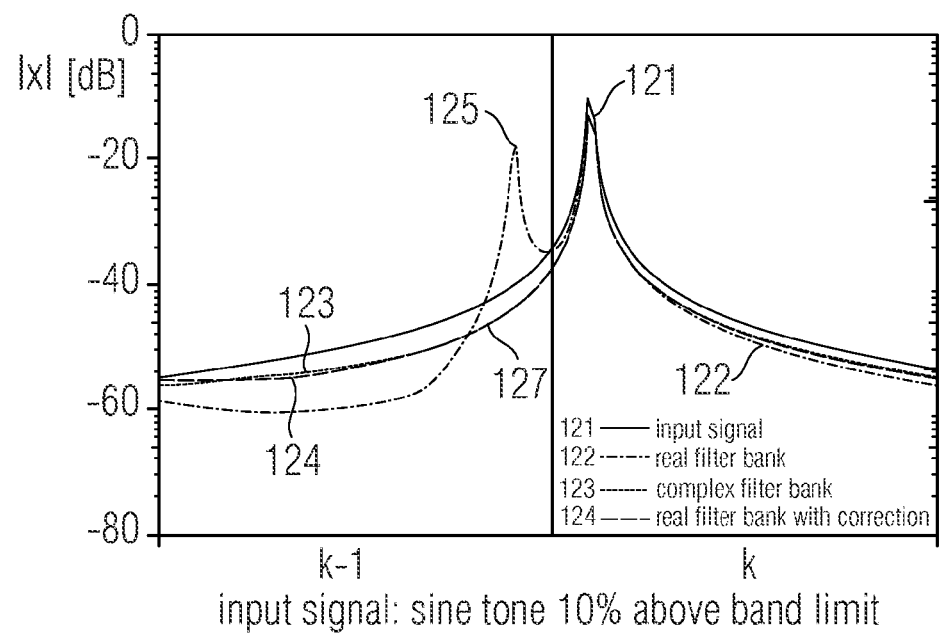
FIG. 14 shows subband filtering of a sine tone at 10% above the band limit.
Figure 15:
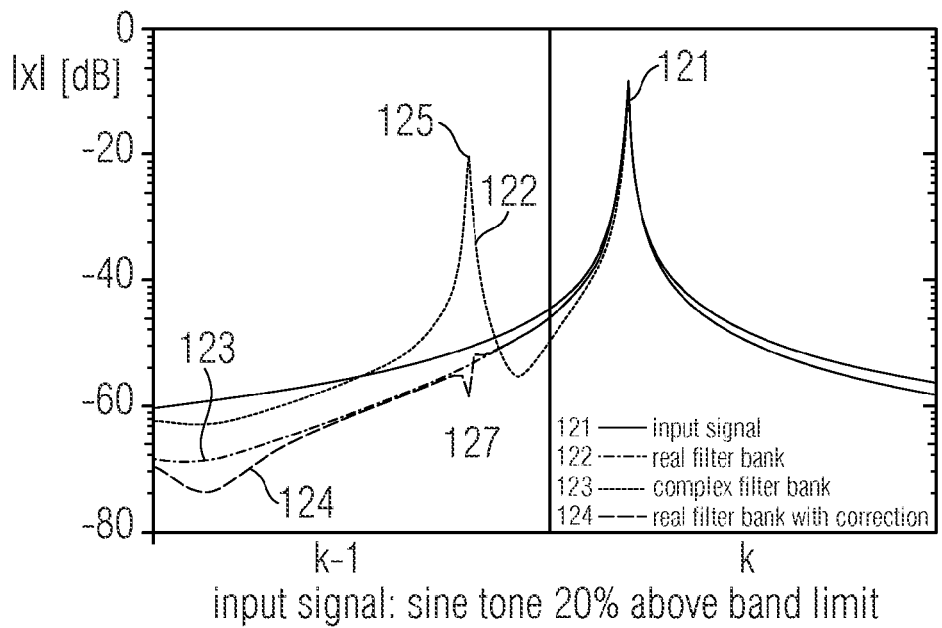
FIG. 15 shows subband filtering of a sine tone at 20% above the band limit.
Figure 16:
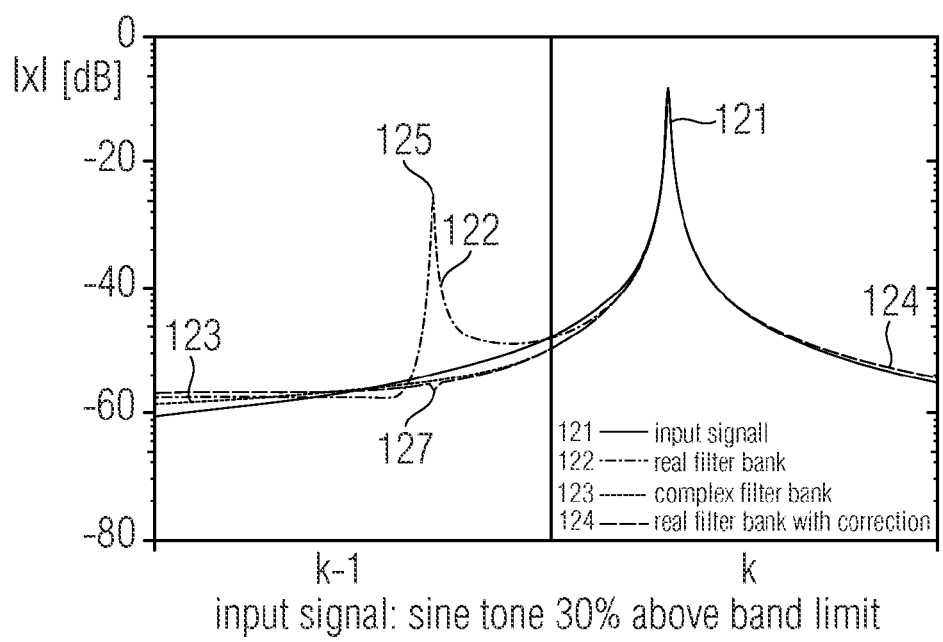
FIG. 16 shows subband filtering of a sine tone at 30% above the band limit.
Figure 17:
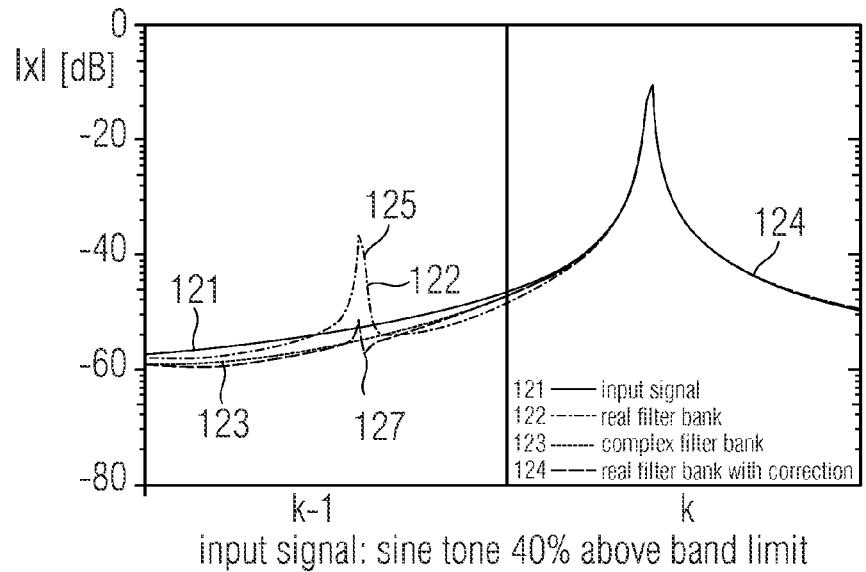
FIG. 17 shows subband filtering of a sine tone at 40% above the band limit.

FIG. 13 shows a similar case as FIG. 12, however with a sine tone at 5% above the band limit. Again, a real filter bank would generate the secondary peak 125. This secondary peak, however, is attenuated nearly completely by the real filter bank including correction 124. Only a very small deviation at 127 is still to be seen. When reducing the filter length of the filters 32 to 35, this peak 127 would continue increasing. Even with degenerated filters, i.e. filters only performing weighting by a weighting factor, the peak 127 would still be smaller than the secondary peak 125. By inventively weighting the filtered values by the difference of the two weighting factors, however, at least for the case of identical or nearly identical weighting factors, almost no interference at all would be introduced, despite the rather rudimentary filtering by degenerated filters.

FIG. 14, FIG. 15, FIG. 16 and FIG. 17 show similar scenarios, wherein the sine tone, however, is in an ever greater distance to the band limit. All the pictures clearly show the aliasing component which would be generated by a real filter bank if no inventive correction was performed. In addition, all the pictures show even smaller deviations at 127 between the real filter bank including correction according to the present invention and an aliasing-resistant complex filter bank 123.

Figure 18:
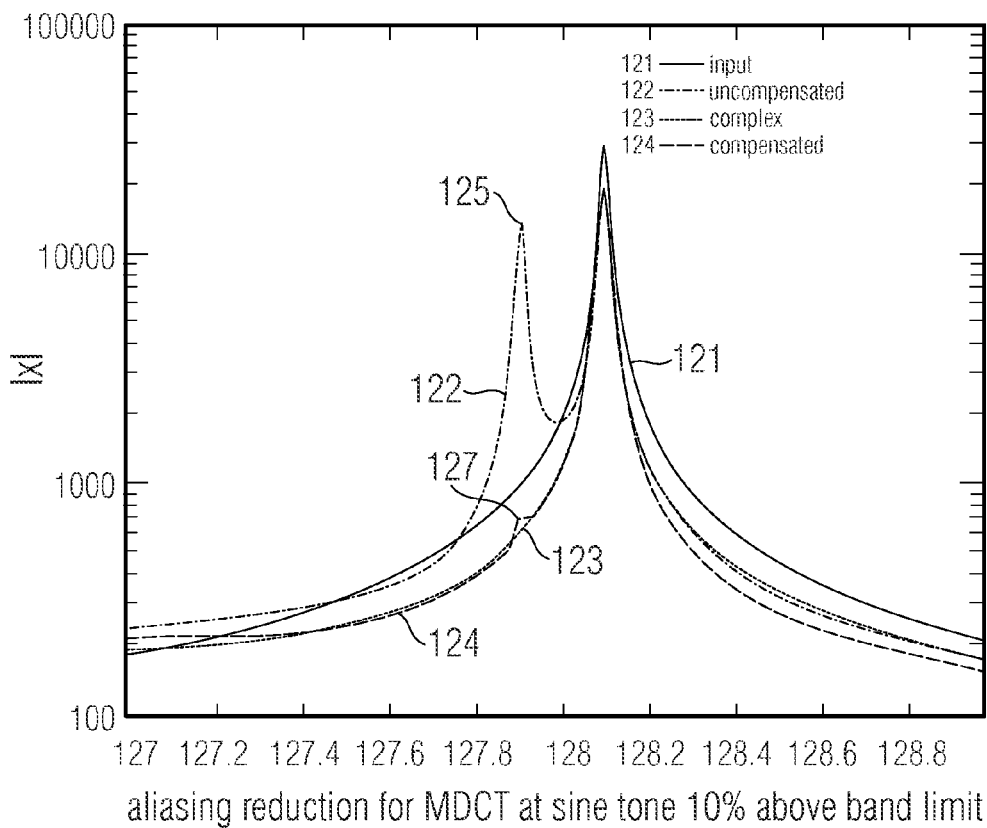
FIG. 18 is a schematic illustration of the aliasing reduction for an MDCT with a sine tone at 10% above the band limit.

FIG. 18 shows a scenario similar to that of FIGS. 12 to 17, however for a transform in the form of the MDCT. Again, the clear aliasing component 125 can be recognized, occurring at a frequency of 127.88. By means of the inventive correction, i.e. by filtering corresponding MDCT coefficients of successive MDCT peaks by the filters 32 to 35, the aliasing component is reduced except for the small deviation at 127 in FIG. 18. If filter lengths of 11 are used for the filters 32 to 35, the entire assembly will only be settled after around 10 MDCT spectra. Thus, in the implementation of FIGS. 3a and 3b, a delay of 5 MDCT blocks may be used until sensitive output values are generated.

Depending on the circumstances, the inventive method may be implemented in either hardware or software. The implementation can be on a digital storage medium, in particular on a disc or a CD having control signals which may be read out electronically, which can cooperate with a programmable computer system such that the corresponding method will be performed. Generally, the invention is thus also in a computer program product having a program code stored on a machine-readable carrier for performing the inventive method when the computer program product runs on a computer. Put differently, the invention may thus also be realized as a computer program having a program code for performing the method when the computer program runs on a computer.

While this invention has been described in terms of several embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations and equivalents as fall within the true spirit and scope of the present invention.

The invention claimed is:

1. An audio processor for processing an audio signal, the audio signal comprising a plurality of real audio subband signals, the plurality of real audio subband signals being a representation of a real discrete-time audio signal, and the plurality of real audio subband signals being generated and output by an analysis filter bank, comprising:
   a weighter configured for weighting a real audio subband signal of the plurality of real audio subband signals generated and output by the analysis filter bank by a weighting factor determined for the real audio subband signal generated and output by the analysis filter bank to obtain a real weighted audio subband signal;
   a correction term determiner configured for calculating a real correction term, the correction term determiner being implemented to calculate the real correction term using at least one other real audio subband signal of the plurality of real audio subband signals generated and output by the analysis filter bank and using an other weighting factor provided for the at least one other real audio subband signal generated and output by the analysis filter bank, the other weighting factor differing from the weighting factor; and
   a combiner configured for combining the real weighted audio subband signal and the real correction term to obtain a corrected real audio subband signal as a processed audio signal,
   wherein at least one of the weighter, the correction term determiner, and the combiner are embodied in hardware.

2. The audio processor according to claim 1, wherein the correction term determiner is implemented
   to calculate a difference between the weighting factor for the real audio subband signal generated and output by the analysis filter bank and the other weighting factor for the at least one other real audio subband signal generated and output by an analysis filter bank, and
   to generate the real correction term in dependence on the difference.

3. The audio processor according to claim 1, wherein the correction term determiner is implemented to calculate the real correction term in dependence on the real audio subband signal, and in dependence on the at least one other real audio subband signal and the other weighting factor.

4. The audio processor according to claim 1, wherein the correction term determiner is implemented to use as the at least one other real audio subband signal a specific real audio subband signal of the plurality of real audio subband signals generated and output by the analysis filter bank, the specific real audio subband signal comprising a frequency range index differing from a frequency range index of the real audio subband signal by "1".

5. The audio processor according to claim 1, wherein the correction term determiner is implemented to determine a further real correction term dependent on a third real audio subband signal of the plurality of real audio subband signals generated and output by the analysis filter bank and a third weighting factor associated to the third real audio subband signal, the third weighting factor differing from the weighting factor.

6. The audio processor according to claim 5, wherein the combiner is implemented to combine the further real correction term and the real weighted audio subband signal and the real correction term.

7. The audio processor according to claim 5, wherein the correction term determiner is implemented to use as the third real audio subband signal of the plurality of real audio subband signals a specific real audio subband signal generated and output by the analysis filter bank, the specific real audio subband signal comprising a frequency range index differing from a frequency range index of the real audio subband signal and from a frequency range index of the at least one other real audio subband signal.

8. The audio processor according to claim 1, further comprising the analysis filter bank configured for filtering the real discrete-time audio signal and for outputting the plurality of real audio subband signals, wherein the analysis filter bank is implemented by a transform of a block of samples of the real discrete-time audio signal to a spectral representation of the block of samples of the real discrete-time audio signal, wherein each real audio subband signal of the plurality of real audio subband signals comprises subband samples comprising spectral coefficients of the same frequency index from a sequence of successive spectral representations.

9. The audio processor according to claim 1, further comprising the analysis filter bank configured for filtering the real discrete-time audio signal to for output the plurality of real audio subband signals, wherein the analysis filter bank is a decimated filter bank comprising filters defined by a modulation of a prototype filter.

10. The audio processor according to claim 8, wherein each real audio subband signal of the plurality of real audio subband signals generated and output by the analysis filter bank is a signal comprising several samples, wherein N/M samples are generated for each signal from a quantity of N values of the discrete-time signal, and wherein M is a number of real audio subband signals of the plurality of real audio subband signals generated and output by the analysis filter bank.

11. The audio processor according to claim 1, wherein the combiner is implemented to perform an addition of the real weighted audio subband signal and the real correction term.

12. The audio processor according to claim 1, further comprising:
a provider for providing the different weighting factors associated to the real audio subband signal and to the at least one other real audio subband signal of the plurality of real audio subband signals generated and output by the analysis filter bank,
wherein the provider is implemented to determine the different weighting factors due to an equalizer function or an echo suppression function or a bandwidth extension function or a parametric multi-channel encoding function for the real discrete-time audio signal.

13. A method for processing an audio signal, the audio signal comprising a plurality of real audio subband signals, the plurality of real audio subband signals being a representation of a real discrete-time audio signal, and the plurality of real audio subband signals being generated and output by an analysis filter bank, the method comprising:
weighting, by a weighter, a real audio subband signal of the plurality of real audio subband signals generated and output by the analysis filter bank by a weighting factor determined for the real audio subband signal generated and output by the analysis filter bank to obtain a real weighted audio subband signal;
calculating, by a calculator, a real correction term using at least one other real audio subband signal of the plurality of real audio subband signals generated and output by the analysis filter bank and using an other weighting factor provided for the at least one other real audio subband signal generated and output by the analysis filter bank, the other weighting factor differing from the weighting factor; and
combining, by a combiner, the real weighted audio subband signal and the real correction term to obtain a corrected real audio subband signal as a processed audio signal,
wherein at least one of the weighter, the correction term determiner, and the combiner are embodied in hardware.

14. An analysis filter bank processor for processing a real discrete-time audio signal, the analysis filter bank processor comprising:
a filter bank configured for generating and outputting a plurality of real audio subband signals from the discrete-time signal; and
a device configured for processing the plurality of real audio subband signals generated and output by the filter bank to obtain a plurality of corrected real audio subband signals, the device comprising, for each real audio subband signal of the plurality of real audio subband signals generated and output by the analysis filter bank:
a weighter configured for weighting the real audio subband signal by a weighting factor determined for the real audio subband signal generated and output by the analysis filter bank to obtain a real weighted audio subband signal;
a correction term determiner configured for calculating a real correction term, the correction term determiner being implemented to calculate the real correction term using at least one other real audio subband signal of the plurality of real audio subband signals generated and output by the analysis filter bank and using an other weighting factor provided for the at least one other real audio subband signal generated and output by the analysis filter bank, the other weighting factor differing from the weighting factor; and
a combiner configured for combining the real weighted audio subband signal and the real correction term to obtain a corrected real audio subband signal of the plurality of corrected real audio subband signals,
wherein at least one of the filter bank, the device for processing, the weighter, the correction term determiner, and the combiner are embodied in hardware.

15. A synthesis filter bank processor for generating a real discrete-time audio signal, the synthesis filter bank processor comprising:
for each real audio subband signal of a plurality of real audio subband signals a device for processing the real audio subband signal of the plurality of real audio subband signals to obtain processed real audio subband signals, the device comprising:
a weighter configured for weighting the real audio subband signal by a weighting factor determined for the real audio subband signal to obtain a real weighted audio subband signal;
a correction term determiner configured for calculating a real correction term, the correction term determiner being implemented to calculate the real correction term using at least one other real audio subband signal of the plurality of real audio subband signals and using an other weighting factor provided for the at least one other real audio subband signal of the plurality of real audio subband signals, the other weighting factor differing from the weighting factor; and a combiner configured for combining the real weighted audio subband signal and the real correction term to obtain a corrected real audio subband signal, whereby processed real audio subband signals are obtained;

a plurality of synthesis filters configured for filtering the processed real audio subband signals to obtain synthesis-filtered audio subband signals; and an adder configured for summing the synthesis-filtered audio subband signals to obtain a discrete-time audio signal, wherein at least one of the device for processing, the weighter, the correction term determiner, the combiner, a synthesis filter of the plurality of synthesis filters, and the adder are embodied in hardware.

16. A method for analysis processing a real discrete-time audio signal, comprising:

generating and outputting a plurality of real audio subband signals from the discrete-time signal using an analysis filter bank; and processing, by a device for processing, the plurality of real audio subband signals generated and output by the analysis filter bank to obtain a plurality of corrected real audio subband signals, the processing comprising, for each real audio subband signal of the plurality of real audio subband signals generated and output by the analysis filter bank:

weighting, by a weighter, a real audio subband signal by a weighting factor determined for the real audio subband signal to obtain a real weighted audio subband signal;

calculating, by a correction term determiner, a real correction term using at least one other real audio subband signal of the plurality of real audio subband signals generated and output by the analysis filter bank and using an other weighting factor provided for the at least one other real audio subband signal generated and output by the analysis filter bank, the other weighting factor differing from the weighting factor; and combining, by a combiner, the real weighted audio subband signal and the real correction term to obtain a corrected real audio subband signal of the plurality of corrected real audio subband signals, wherein at least one of the analysis filter bank, the device for processing, the weighter, the correction term determiner, and the combiner are embodied in hardware.

17. A method of synthesis processing for generating a real discrete-time audio signal, the method of synthesis processing comprising:

for each real audio subband signal of a plurality of real audio subband signals, processing the real audio subband signal of the plurality of real audio subband signals to obtain real processed audio subband signals, the processing comprising:

weighting, by a weighter, the real audio subband signal by a real weighting factor determined for the real audio subband signal to obtain a real weighted audio subband signal;

calculating, by a correction term determiner, a real correction term using at least one other real audio subband signal of the plurality of real audio subband signals and using an other weighting factor provided for the at least one other real audio subband signal of the plurality of real audio subband signals, the other weighting factor differing from the weighting factor; and combining, by a combiner, the real weighted audio subband signal and the real correction term to obtain a corrected real audio subband signal, whereby the processed real audio subband signals are obtained;

filtering, by a plurality of synthesis filters, the processed real audio subband signals to obtain synthesis-filtered audio subband signals; and summing, by an adder, the synthesis-filtered audio subband signals to obtain a discrete-time audio signal, wherein at least one of the device for processing, the weighter, the correction term determiner, the combiner, a synthesis filter of the plurality of synthesis filters, and the adder are embodied in hardware.

18. A non-transitory storage medium having stored thereon a computer program comprising a program code for performing, when the computer program runs on a computer, the method for processing an audio signal, the audio signal comprising a plurality of real audio subband signals, the plurality of real audio subband signals being a representation of a real discrete-time audio signal, and the plurality of real audio subband signals being generated and output by an analysis filter bank, the method comprising:

weighting a real audio subband signal of the plurality of real audio subband signals generated and output by the analysis filter bank by a weighting factor determined for the real audio subband signal generated and output by the analysis filter bank to obtain a real weighted audio subband signal;

calculating a real correction term using at least one other real audio subband signal of the plurality of real audio subband signals generated and output by the analysis filter bank and using an other weighting factor provided for the at least one other real audio subband signal generated and output by the analysis filter bank, the other weighting factor differing from the weighting factor; and combining the real weighted audio subband signal and the real correction term to obtain a corrected real audio subband signal.

19. A non-transitory storage medium having stored thereon a computer program comprising a program code for performing a method for analysis processing a real discrete-time audio signal, comprising:

generating a plurality of real audio subband signals from the discrete-time signal using a filter bank; and processing the plurality of real audio subband signals generated and output by the analysis filter bank to obtain a plurality of corrected real audio subband signals, the processing comprising, for each real audio subband signal of the plurality of real audio subband signals generated and output by the analysis filter bank:

weighting a real audio subband signal by a weighting factor determined for the real audio subband signal to obtain a real weighted audio subband signal;

calculating a real correction term using at least one other real audio subband signal of the plurality of real audio subband signals generated and output by the analysis filter bank and using an other weighting factor provided for the at least one other real audio subband signal generated and output by the analysis filter bank, the other weighting factor differing from the weighting factor; and combining the real weighted audio subband signal and the real correction term to obtain a corrected real audio subband signal of the plurality of corrected real audio subband signals.

20. A non-transitory storage medium having stored thereon a computer program comprising a program code for performing a method of synthesis processing for generating a real discrete-time audio signal, the method of synthesis processing comprising:
for each real audio subband signal of a plurality of real audio subband signals, processing the real audio subband signal of the plurality of real audio subband signals to obtain real processed audio subband signals, the processing comprising:
weighting the real audio subband signal by a real weighting factor determined for the real audio subband signal to obtain a real weighted audio subband signal;
calculating a real correction term using at least one other real audio subband signal of the plurality of real audio subband signals and using an other weighting factor provided for the at least one other real audio subband signal of the plurality of real audio subband signals, the other weighting factor differing from the weighting factor; and
combining the real weighted audio subband signal and the real correction term to obtain a corrected real audio subband signal, whereby the processed real audio subband signals are obtained;
synthesis filtering the processed real audio subband signals to obtain synthesis-filtered audio subband signals; and
summing the synthesis-filtered audio subband signals to obtain a discrete-time audio signal.

21. The audio processor according to claim 1, wherein the correction term determiner is configured for calculating the real correction term such that the corrected real audio subband signal has a reduced aliasing when being combined with the real correction term.

22. The audio processor according to claim 1,
wherein the real audio subband signal has a sequence of samples,
wherein the weighter is configured for weighting each sample of the sequence of samples by the weighting factor determined for the real audio subband signal to obtain the real weighted audio subband signal, and
wherein the correction term determiner is configured by filtering using a filter having more than 8 filter taps.

23. The audio processor according to claim 1,
wherein the weighter is configured for weighting a further real audio subband signal neighboring the real audio subband signal by a further weighting factor, the further weighting factor being different from the weighting factor;
wherein the correction term determiner is implemented to generate the real correction term in dependence on a difference of the weighting factor of the real audio subband signal and the further weighting factors for the further real audio subband signal from the plurality of real audio subband signals, and
wherein the further weighting factor is a further amplification factor provided and applied for all samples of the further subband signal and wherein the weighting factor is an amplification factor provided and applied for all samples of the real audio subband signal.

24. The audio processor of claim 1, being implemented in at least one of a consumer electronics device, a communications electronics device, an audio equalizer, an audio echo suppressor, an audio encoder, an audio decoder, and an audio post-processor.

\* \* \* \* \*